United States Patent
Tanabe et al.

(10) Patent No.: US 9,823,278 B2
(45) Date of Patent: Nov. 21, 2017

(54) FAULT DETECTING APPARATUS AND COMPUTER PROGRAM THEREFOR

(71) Applicant: SHINDENGEN ELECTRIC MANUFACTURING CO., LTD., Tokyo (JP)

(72) Inventors: Tomohiro Tanabe, Saitama (JP); Kazuya Okabe, Saitama (JP); Daisuke Hagiwara, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 364 days.

(21) Appl. No.: 14/565,003

(22) Filed: Dec. 9, 2014

(65) Prior Publication Data
US 2015/0160324 A1    Jun. 11, 2015

(30) Foreign Application Priority Data

Dec. 11, 2013 (JP) .................................. 2013-256361

(51) Int. Cl.
*G01R 19/00* (2006.01)

(52) U.S. Cl.
CPC .................. *G01R 19/0092* (2013.01)

(58) Field of Classification Search
CPC combination set(s) only.
See application file for complete search history.

(56) References Cited

U.S. PATENT DOCUMENTS

| 2004/0044459 A1* | 3/2004 | Wakao | B60K 23/0808 701/69 |
| 2004/0189318 A1* | 9/2004 | Kitagawa | H02M 7/5387 324/523 |
| 2004/0232872 A1* | 11/2004 | Sunaga | B60H 1/00857 318/652 |
| 2009/0219661 A1 | 9/2009 | Mitsuda | |
| 2010/0014197 A1* | 1/2010 | Jackson | H02H 3/332 361/42 |
| 2012/0256636 A1* | 10/2012 | Truong | H02M 1/32 324/415 |
| 2013/0051100 A1* | 2/2013 | Daigo | H02M 3/1584 363/124 |

FOREIGN PATENT DOCUMENTS

| JP | H09-196991 A | 7/1997 |
| JP | 2002-238299 A | 8/2002 |
| JP | 2005-086948 A | 3/2005 |
| JP | 2006-252416 A | 9/2006 |
| JP | 2007-134780 A | 5/2007 |
| JP | 2013-044668 A | 3/2013 |

OTHER PUBLICATIONS

Japan Patent Office, Office Action for Japanese patent application No. 2013-256361, dated Feb. 21, 2017.

* cited by examiner

*Primary Examiner* — Giovanni Astacio-Oquendo
*Assistant Examiner* — Alvaro Fortich (57) ABSTRACT

A fault detecting apparatus, to use an output current from a drive circuit as a current value detected by a current sensor, calculates a duty ratio of a control signal to be supplied to the drive circuit to define the duty ratio as a theoretical value of the duty ratio of the control signal. The fault detecting apparatus compares a duty ratio of a control signal actually supplied to the drive circuit with the theoretical value of the duty ratio of the control signal to determine whether the current sensor (fails on the basis of a comparison result.

6 Claims, 10 Drawing Sheets

FAULT DETECTING APPARATUS AND COMPUTER PROGRAM THEREFOR

CROSS REFERENCE TO RELATED APPLICATIONS

This application is based on and claims the benefit of priority to Japanese Patent Application No. 2013-256361 filed on Dec. 11, 2013, the contents of which are hereby incorporated by reference in their entirety.

TECHNICAL FIELD

The present invention relates to a fault detecting apparatus and a computer program therefor in a current detecting circuit.

BACKGROUND ART

In various conventional devices and apparatuses, a current detector detects a current, and control depending on a detection result is performed (for example, see Patent Documents 1 and 2).

In the above devices and apparatuses, when the current detector cannot accurately detect a current, control cannot be properly performed. For this reason, a failure of the current detector must be able to be detected.

Figure 10:
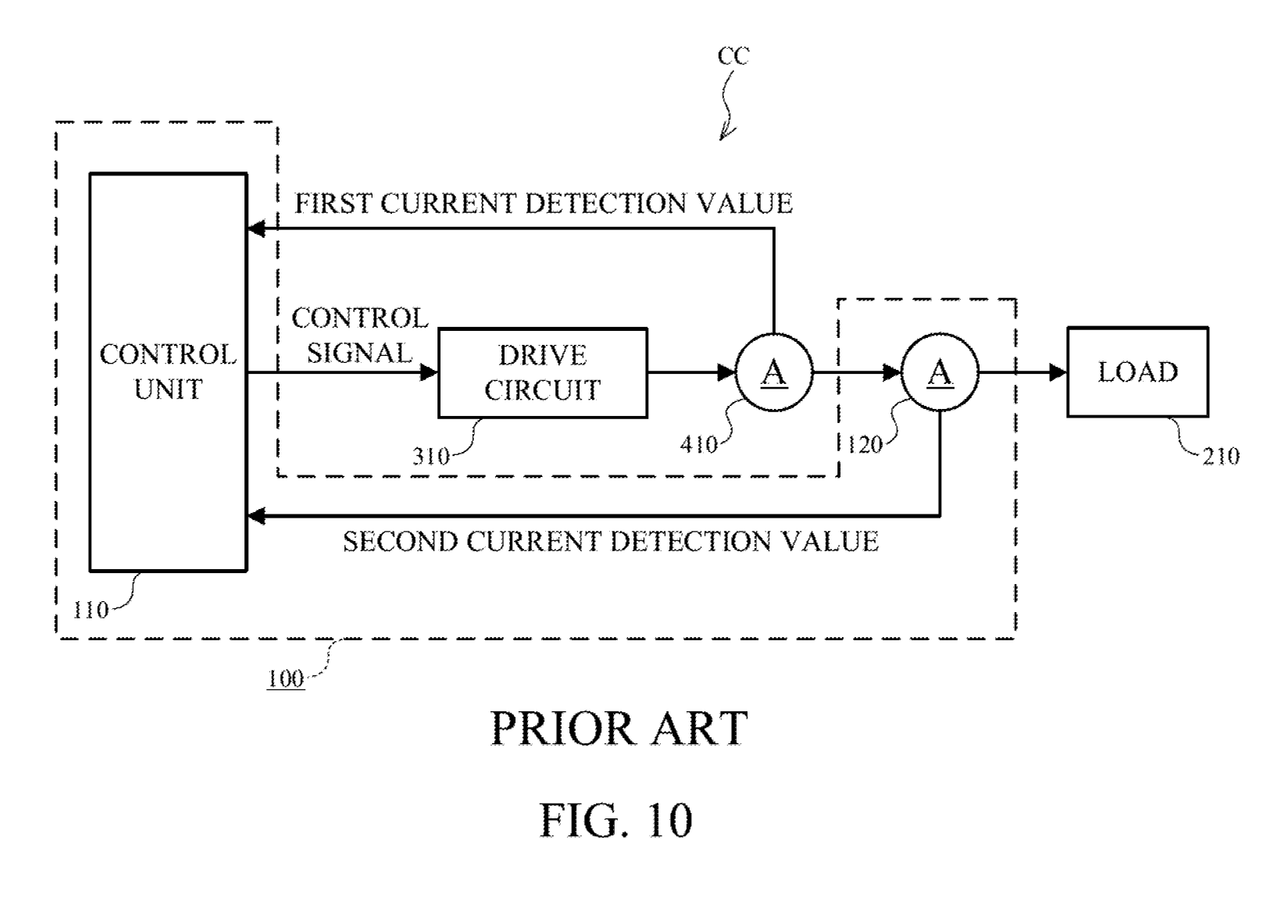
FIG. 10 is a block diagram of a drive apparatus including a fault detecting apparatus according to a conventional technique.

FIG. 10 is a block diagram of a drive apparatus CC including a fault detecting apparatus 100 according to a conventional example. The drive apparatus CC is to supply a power and a drive signal to a load 210, and includes a fault detecting apparatus 100 having a control unit 110 and a current sensor 120, a drive circuit 310, and a current sensor 410.

The drive circuit 310 includes a switch element (not shown). The drive circuit 310 turns on/off the switch element depending on a control signal supplied from the control unit 110 to change outputs.

An output current from the drive circuit 310 changes depending on an on/off operation of the switch element, is detected by the current sensor 410, and is also detected by the current sensor 120. A detection result obtained by the current sensor 410 is sent to the control unit 110 as a first current detection value, and a detection result obtained by the current sensor 120 is sent to the control unit 110 as a second current detection value.

The control unit 110 generates a control signal depending on the first current detection value and transmits the control signal to the drive circuit 310. The control unit 110 compares the first current detection value with the second current detection value. When the values are different from each other, the control unit 110 determines that the current sensor 410 fails. For this reason, the failure of the current sensor 410 can be detected by the fault detecting apparatus 100.

CITATION LIST

Patent Literature

PTL 1: Unexamined Japanese Patent Publication No. 2005-86948
PTL 2: Unexamined Japanese Patent Publication No. 2002-238299

SUMMARY OF THE INVENTION

Technical Problem

The fault detecting apparatus 100 requires the current sensor 120 to detect a failure of the current sensor 410. For this reason, the current sensor 120 is a factor of inhibiting the miniaturization of the fault detecting apparatus 100.

The present invention has been made in consideration of the above problem and has as its object to miniaturize a fault detecting apparatus for detecting a failure of a current detector.

Solution to Problem

The present invention proposes the following items to solve the above problem.

(1) The present invention proposes a fault detecting apparatus (for example, corresponding to a fault detecting apparatus 1 in FIG. 1) for a current detecting circuit (for example, corresponding to a current sensor 410 in FIG. 1) for detecting a current (for example corresponding to an output current from a drive circuit 310 (will be described later)) changing depending on an on/off operation of a switch element (for example, corresponding to a switch element arranged on the drive circuit 310 in FIG. 1), including: a switching control unit (for example, corresponding to a switching control unit 11 in FIG. 2) that supplies a control signal to the switch element to on/off-control the switch element; a comparing unit (for example, corresponding to a comparing unit 12 in FIG. 2) that compares a duty ratio of the control signal supplied from the switching control unit to the switch element with a theoretical value of the duty ratio of the control signal; and a fault detecting unit (for example, corresponding to a fault detecting unit 13 in FIG. 2) that detects a failure of the current detecting circuit on the basis of a comparison result obtained by the comparing unit, wherein the comparing unit, to use the current changing depending on the on/off operation of the switch element as a current value detected by the current detecting circuit, calculates a duty ratio of a control signal to be supplied to the switch element to define the duty ratio as the theoretical value of the duty ratio of the control signal.

In this case, the current changing depending on the on/off operation of the switch element changes depending on a duty ratio of a control signal supplied to the switch element. A current value of the current changing depending on the on/off operation of the switch element is accurately detected when the current detecting circuit is normal, and is not accurately detected when the current detecting circuit fails.

As described above, when the current detecting circuit is normal, the duty ratio of the control signal supplied to the switch element is equal to a theoretical value of the duty ratio of the control signal. On the other hand, when the current detecting circuit fails, the duty ratio of the control signal supplied to the switch element is different from the theoretical value of the duty ratio of the control signal.

Thus, according to the present invention, the comparing unit is designed to compare the duty ratio of the control signal supplied to the switch element with the theoretical value of the duty ratio of the control signal. For this reason, since a failure of the current detecting circuit can be detected without using another current detecting circuit to detect the failure of the current detecting circuit, the fault detecting apparatus can be miniaturized.

(2) The present invention proposes the fault detecting apparatus of (1) wherein the comparing unit calculates the theoretical value of the duty ratio of the control signal on the basis of the voltage (for example, corresponding to the output voltage $V_{OUT}$ from the drive circuit 310 (will be described later)) changing depending on the on/off operation of the switch element and a resistance (for example, corresponding to a resistance R of a load 210 (will be described later)) of a load (corresponding to the load 210 in FIG. 1) to which the voltage is supplied.

According to the invention, in the fault detecting apparatus of (1), the comparing unit is designed to calculate the theoretical value of the duty ratio of the control signal on the basis of the voltage changing depending on the on/off operation of the switch element and the resistance of the load to which the voltage is supplied. For this reason, the theoretical value of the duty ratio of the control signal can be easily calculated.

(3) The present invention proposes a fault detecting apparatus for current detecting circuits that detect currents changing depending on on/off operations of a plurality of switch elements, the number of current detecting circuits being equal to the number of switch circuits, comprising: a switching control unit that independently supplies control signals to the plurality of switch elements, respectively, on/off-controls each of the plurality of switch elements, and equalizes current values detected by the plurality of current detecting circuits, respectively; a comparing unit that compares duty ratios of the control signals independently supplied to the plurality of switch elements, respectively, with each other, and compares the duty ratio of the control signal supplied from the switching control unit with a theoretical value of the duty ratio of the control signal in each of the switch elements; and a fault detecting unit that detects failures of the plurality of current detecting circuits on the basis of a comparison result obtained by the comparing unit, wherein the comparing unit, in order to define currents changing depending on on/off operations of the plurality of switch elements as current values detected by the plurality of current detecting circuits, respectively, calculates duty ratios of control signals to be supplied to the plurality of switch elements for the plurality of switch elements, respectively, to define the calculated duty ratios as theoretical values of the duty ratios of the control signals in the plurality of switch elements, respectively.

A case in which a plurality of switch elements are arranged and current detecting circuits each of which is paired with each of the switch elements are normal will be examined below. In this case, when the duty ratios of the control signals supplied to the switch elements are equalized to each other, current values detected by the current detecting circuits become equal to each other.

A case in which a plurality of switch elements are arranged and at least one of the current detecting circuits each of which is paired with each of the switch elements fails will be examined below. In this case, even the though duty ratios of control signals supplied to the switch elements are equalized to each other, the current detecting circuits include some current detecting circuit having a detected current value different from those of the other current detecting circuits.

As described above, when the current values detected by the current detecting circuits are equalized to each other, the duty ratios of the control signals supplied to the switch elements are compared with each other to make it possible to determine whether the current detecting circuits include some faulty current detecting circuit.

According to the invention, the switching control unit is designed to independently supply control signals to the plurality of switch elements, respectively, on/off-controls each of the plurality of switch elements, and equalize current values detected by the plurality of current detecting circuits, respectively. The comparing unit is designed to compare the duty ratios of the control signals independently supplied to the plurality of switch elements, respectively. For this reason, since the failure of the current detecting circuit can be more accurately detected without using another current detecting circuit to detect the failure of the current detecting circuit, the fault detecting apparatus can be miniaturized.

(4) The present invention proposes a fault detecting apparatus (for example, corresponding to a fault detecting apparatus 1A in FIG. 5) for a current detecting circuit (for example, corresponding to a current sensor 410, 420 in FIG. 5) that detects currents (for example, corresponding to an output current from the drive circuit 310 (will be described later) and an output current from a drive circuit 320 (will be described later)) changing depending on on/off operations of switch elements (for example, corresponding to a switch element arranged on the drive circuit 310 in FIG. 5 and a switch element arranged on the drive circuit 320 in FIG. 5), wherein, as the switch element, a plurality of switch elements are arranged, as the current detecting circuit, the number of which is equal to the number of switch elements are arranged, each of the plurality of current detecting circuits detects a current changing depending on on/off operations of each of pairs of switch elements of the plurality of switch elements, includes: switching control units (for example, corresponding to a first switching control unit 14 and a second switching control unit 15 in FIG. 6) that independently supply control signals to the plurality of switch element, respectively, on/off-control each of the plurality of switch elements, and equalize current values detected by the plurality of current detecting circuits, respectively; a comparing unit (for example, corresponding to a comparing unit 12A in FIG. 6) that compares duty ratios of the control signals independently supplied to the plurality of switch elements, respectively; and a fault detecting unit (for example, corresponding to a fault detecting unit 13A in FIG. 6) that detects failures of the plurality of current detecting circuits on the basis of a comparison result obtained by the comparing unit.

According to the present invention, the switching control unit is designed to independently supply control signals to the plurality of switch elements, respectively, on/off-control each of the plurality of switch elements, and equalize current values detected by the plurality of current detecting circuits, respectively. The comparing unit is designed to compare duty ratios of the control signals independently supplied to the plurality of switch elements, respectively. For this reason, since a failure of the current detecting circuit can be detected without using another current detecting circuit to detect the failure of the current detecting circuit, the fault detecting apparatus can be miniaturized.

(5) The present invention provides a computer program product having a non-transitory computer (for example, corresponding to the control unit 10 in FIG. 1) readable medium storing a program which, when executed by a computer, causes the computer to perform a fault detecting method for a current detecting circuit (for example the current sensor 410 in FIG. 1) which detects a current (for example, corresponding to an output current from the drive circuit 310 (will be described later)) changing depending on an on/off operation of a switch element (for example, corresponding to a switch element arranged on the drive circuit 310 in FIG. 1). The fault detecting method including: the first step (for example, corresponding to a process performed by the switching control unit 11 in FIG. 2) of supplying a control signal to the switch element to on/off-control the switch element; the second step (for example, corresponding to a process performed by the comparing unit 12 in FIG. 2) of, to use the current changing depending on the on/off operation of the switch element as a current value detected by the current detecting circuit, calculating a duty ratio of a control signal to be supplied to the switch element to define the duty ratio as the theoretical value of the duty ratio of the control signal; the third step (for example, corresponding to a process performed by the comparing unit 12 in FIG. 2) of comparing the duty ratio of the control signal supplied to the switch element in the first step with the theoretical value of the duty ratio of the control signal calculated in the second step; and the fourth step (for example, corresponding to a process performed by the fault detecting unit 13 in FIG. 2) of detecting a failure of the current detecting circuit on the basis of a comparison result obtained in the third step.

According to the invention, the program is executed by using the computer to compare the duty ratio of the control signal supplied to the switch element with the theoretical value of the duty ratio of the control signal. For this reason, since a failure of the current detecting circuit can be detected without using another current detecting circuit to detect the failure of the current detecting circuit, the fault detecting apparatus can be miniaturized.

(6) The present invention provides a computer program product having a non-transitory computer (for example, corresponding to a control unit 10A in FIG. 5) readable medium storing a program which, when executed by a computer, causes the computer to perform a fault detecting method for a current detecting circuit (for example, corresponding to the current sensor 410, 420) which detects a current (for example, corresponding to an output current from the drive circuit 310 (will be described later) and an output current from the drive circuit 320 (will be described later)) changing depending on an on/off operation of a switch element (for example, corresponding to a switch element arranged on the drive circuit 310 in FIG. 5 and a switch element arranged on the drive circuit 320 in FIG. 5), wherein, as the switch element, a plurality of switch elements are arranged, as the current detecting circuit, the number of which is equal to the number of switch elements are arranged, each of the plurality of current detecting circuits detects a current changing depending on on/off operations of each of pairs of switch elements of the plurality of switch elements. The fault detecting method including: the first step (for example, corresponding to processes performed by the first switching control unit 14 and the second switching control unit 15 in FIG. 6) of independently supplying control signals to the plurality of switch elements, respectively, on/off-controlling each of the plurality of switch elements, and equalizing current values detected by the plurality of current detecting circuits; the second step (for example, corresponding to a process performed by the comparing unit 12A in FIG. 6) of comparing duty ratios of the control signals independently supplied to the plurality of switch elements, respectively, with each other; and the third step (for example, corresponding to a process performed by the fault detecting unit 13A in FIG. 6) of detecting failures of the plurality of current detecting circuits on the basis of a comparison result obtained in the second step.

According to the invention, the program is executed by using the computer to independently supply the control signals to the plurality of switch elements, respectively, on/off-control each of the plurality of switch elements, and equalize the current values detected by the plurality of current detecting circuits, respectively. The duty ratios of the control signals independently supplied to the plurality of switch elements, respectively, are designed to be compared with each other. For this reason, since a failure of the current detecting circuit can be detected without using another current detecting circuit to detect the failure of the current detecting circuit, the fault detecting apparatus can be miniaturized.

Effects of the Invention

According to the present invention, since a failure of a current detecting circuit can be detected without using another current detecting circuit to detect the failure of the current detecting circuit, a fault detecting apparatus can be miniaturized.

DETAILED DESCRIPTION OF PREFERRED EMBODIMENTS

Embodiments of the present invention will be described below with reference to the accompanying drawings. Note that constituent elements in the following embodiments can be arbitrarily replaced with existing constituent elements or the like. Various variations including combinations of the constituent elements and other existing constituent elements can be effected. Thus, the descriptions of the following embodiments do not limit the contents of the invention described in the scope of claims.

First Embodiment

Figure 1:
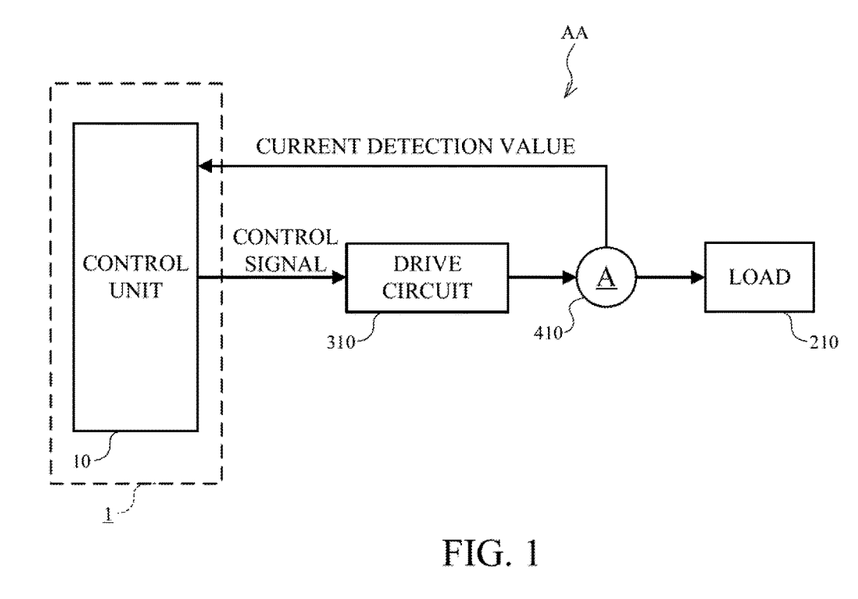
FIG. 1 is a block diagram of a drive apparatus including a fault detecting apparatus according to a first embodiment of the present invention.

FIG. 1 is a block diagram of a drive apparatus AA including a fault detecting apparatus 1 according to a first embodiment of the present invention. Like a drive apparatus CC shown in FIG. 10, the drive apparatus AA is to supply an electric power and a drive signal to a load 210. The drive apparatus AA is different from the drive apparatus CC in that the fault detecting apparatus 1 is arranged in place of a fault detecting apparatus 100. In the drive apparatus AA, the same reference signs denote the same constituent elements. A description of the same constituent elements will not be omitted.

The fault detecting apparatus 1 includes a control unit 10. The control unit 10 is configured by a microcomputer such as an MCU (Micro Controller Unit) or an MPU (Micro Processing Unit), and executes a program stored in a non-transitory storage medium to achieve processes (will be described later). As the storage medium described above, for example, a ROM (Read Only Memory) arranged on a microcomputer, a nonvolatile memory such as EPROM or a flash memory, a magnetic disk such as a hard disk, a CD-ROM, or the like can be applied.

Figure 2:
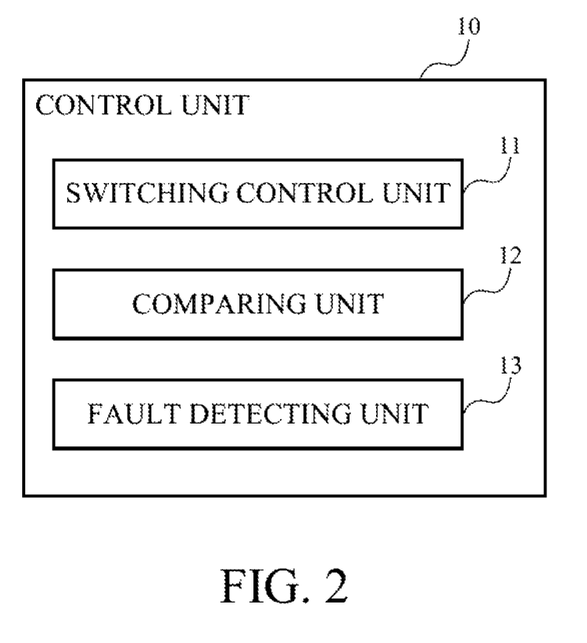
FIG. 2 is a block diagram of a control unit included in the fault detecting apparatus according to the first embodiment of the present invention.

FIG. 2 is a block diagram of the control unit 10. The control unit 10 includes a switching control unit 11, a comparing unit 12, and a fault detecting unit 13.

The switching control unit 11 supplies a control signal to a drive circuit 310 to on/off-control a switch element (not shown) arranged on the drive circuit 310. The switching control unit 11 also supplies the control signal to be supplied to the drive circuit 310 to the comparing unit 12.

The comparing unit 12 compares duty ratios of control signals of two types (will be described later).

As one of the duty ratios of the control signals of the two types, a duty ratio of a control signal supplied from the switching control unit 11 to the drive circuit 310, i.e., a duty ratio of a control signal actually output from the switching control unit 11 is applied.

As the other of the duty ratios of the control signals of the two types, a theoretical value of the duty ratio of the control signal supplied from the switching control unit 11 to the drive circuit 310 is applied. The theoretical value of the duty ratio of the control signal is a duty ratio of a control signal to be supplied to the drive circuit 310 to use an output current from the drive circuit 310 as a current value detected by a current sensor 410. The theoretical value of the duty ratio of the control signal, as shown in FIG. 3, changes depending on the output current from the drive circuit 310 and an input voltage to the drive circuit 310.

Figure 3:
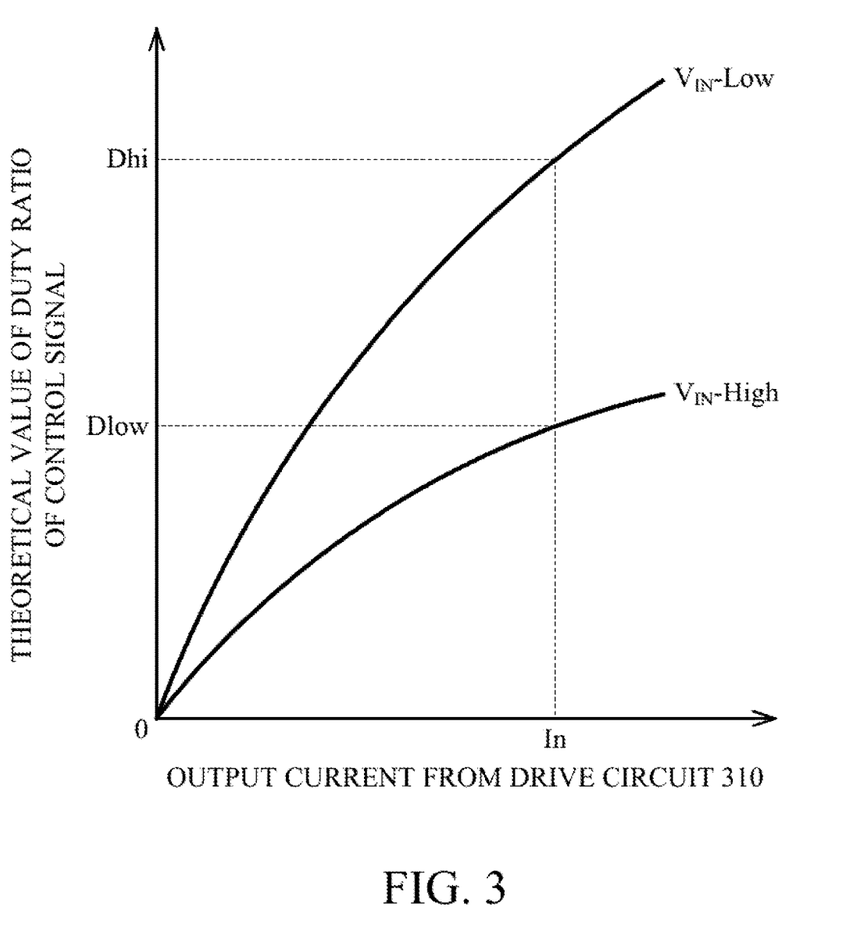
FIG. 3 is a graph showing characteristics of a theoretical value of a duty ratio of a control signal.

FIG. 3 is a graph showing characteristics of the theoretical value of the duty ratio of the control signal. In FIG. 3, the ordinate indicates the theoretical value of the duty ratio of the control signal, and the abscissa indicates an output current from the drive circuit 310. A curve denoted by $V_{IN}$—Low shows a relationship between the theoretical value of the duty ratio of the control signal when the input voltage to the drive circuit 310 is minimum and the output current from the drive circuit 310. A curve denoted by $V_{IN}$—High shows a relationship between the theoretical value of the duty ratio of the control signal when the input voltage to the drive circuit 310 is maximum and the output current from the drive circuit 310.

As shown in FIG. 3, when the output current from the drive circuit 310 is known, the upper limit and the lower limit of the theoretical value of the duty ratio of the control signal is known. For example, when the output current from the drive circuit 310 is given by In, the upper limit of the theoretical value of the duty ratio of the control signal becomes Dhi, and the lower limit of the theoretical value of the duty ratio of the control signal becomes Dlow.

Thus, the comparing unit 12 calculates the theoretical value of the duty ratio of the control signal from the following Expressions (1) to (3).

[Expression 1]

$$V_{OUT} = I \times R \quad (1)$$

In Expression (1), reference symbol I denotes a current detection value of the current sensor 410. Reference symbol R denotes a resistance of the load 210 that has been calculated in advance. Reference symbol $V_{OUT}$ denotes the output voltage from the drive circuit 310. Expression (2) is assigned to $V_{OUT}$ in Expression (1) when the drive circuit 310 steps up the input voltage. When the drive circuit 310 steps down the input voltage, the following Expression (3) is assigned to $V_{OUT}$ in Expression (1).

[Expression 2]

$$V_{OUT} = \frac{V_{IN}}{1-D} \quad (2)$$

[Expression 3]

$$V_{OUT} = V_{IN} \times D \quad (3)$$

In Expressions (2) and (3), reference symbol D denotes the theoretical value of the duty ratio of the control signal, the value serving as an object to be calculated by the comparing unit 12. Reference symbol $V_{IN}$ denotes the input voltage of the drive circuit 310, the input voltage serving as a known voltage like a power supply voltage required for an operation of the drive circuit 310. When the minimum value of the input voltage of the drive circuit 310 is input as $V_{IN}$, the upper limit of the theoretical value of the duty ratio of the control signal can be calculated. When the maximum value of the input voltage of the drive circuit 310 is input as $V_{IN}$, the lower limit of the theoretical value of the duty ratio of the control signal can be calculated.

First, a case in which the current sensor 410 normally operates will be examined below. In this case, the current sensor 410 can accurately detect the output current from the drive circuit 310. For this reason, since a current detection value of the current sensor 410 is equal to a current value of a current actually output from the drive circuit 310, the duty ratio of the control signal actually output from the switching control unit 11 falls within the range from the upper limit to the lower limit of the theoretical value of the duty ratio of the control signal calculated by Expressions (1) to (3) described above.

When a case in which the current sensor 410 fails will be examined below. In this case, the current sensor 410 cannot accurately detect the output current from the drive circuit 310. For this reason, since the current detection value of the current sensor 410 is different from the current value of the current actually output from the drive circuit 310, the duty ratio of the control signal actually output from the switching control unit 11 may not fall within the range from the upper limit to the lower limit of the theoretical value of the duty ratio of the control signal calculated by Expressions (1) to (3) described above.

The fault detecting unit 13 detects a failure of the current sensor 410 on the basis of a comparison result obtained by the comparing unit 12. More specifically, when the duty ratio of the control signal actually output from the switching control unit 11 falls within the range from the upper limit to the lower limit of the theoretical value of the duty ratio of the control signal, it is determined that the current sensor 410 is normal. On the other hand, when the duty ratio of the control signal actually output from the switching control unit 11 does not fall within the range from the upper limit to the lower limit of the theoretical value of the duty ratio of the control signal, it is determined that the current sensor 410 fails.

Figure 4:
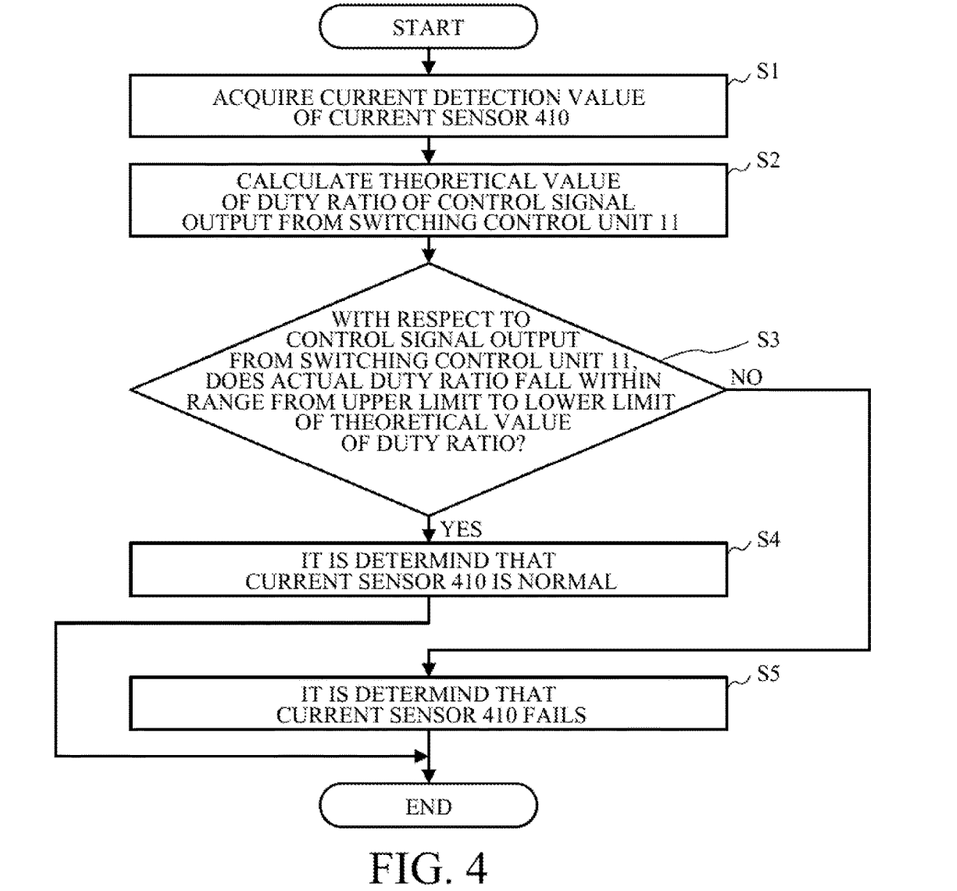
FIG. 4 is a flowchart showing a process of a fault detecting apparatus according to the first embodiment of the present invention.

FIG. 4 is a flow chart showing a process of the fault detecting apparatus 1. The fault detecting apparatus 1 performs the process in FIG. 4 at the start of the drive apparatus AA.

In step S1, the fault detecting apparatus 1 causes the comparing unit 12 to acquire a detection result of the output current from the drive circuit 310 obtained by the current sensor 410 to shift the process to step S2.

In step S2, the fault detecting apparatus 1 causes the comparing unit 12 to calculate a duty ratio of a control signal to be supplied to the drive circuit 310 to use the output current from the drive circuit 310 as the current value acquired in step S1, i.e., the theoretical value of the duty ratio of the control signal to shift the process to step S3.

In step S3, the fault detecting apparatus 1 causes the comparing unit 12 to compare the duty ratio of the control signal actually output from the switching control unit 11 with the theoretical value of the duty ratio of the control signal calculated in step S2. When the duty ratio of the control signal actually output from the switching control unit 11 falls within the range from the upper limit to the lower limit of the theoretical value of the duty ratio of the control signal, the fault detecting apparatus 1 shifts the process to step S4. When the duty ratio of the control signal actually output from the switching control unit 11 does not fall within the range from the upper limit to the lower limit of the theoretical value of the duty ratio of the control signal, the fault detecting apparatus 1 shifts the process to step S5.

In step S4, the fault detecting apparatus 1 causes the fault detecting unit 13 to determine that the current sensor 410 is normal to end the process in FIG. 4.

In step S5, the fault detecting apparatus 1 causes the fault detecting unit 13 to determine that the current sensor 410 fails to end the process in FIG. 4.

According to the fault detecting apparatus 1 described above, the following effects can be exerted.

The fault detecting apparatus 1 causes the comparing unit 12 to compare the duty ratio of the control signal actually output from the switching control unit 11 with the theoretical value of the duty ratio of the control signal. For this reason, since a failure of the current sensor 410 can be detected without using another current sensor to detect the failure of the current sensor 410, the fault detecting apparatus 1 can be miniaturized.

The fault detecting apparatus 1 causes the comparing unit 12 to calculate the theoretical value of the duty ratio of the control signal by using Expressions (1) to (3) on the basis of the output voltage $V_{OUT}$ from the drive circuit 310 and the resistance R of the load 210 to which the output voltage $V_{OUT}$ is supplied. In this case, in Expression (1), a current detection value I of the current sensor 410 can be calculated by the current sensor 410, and the resistance R of the load 210 is a known value. The output voltage $V_{OUT}$ from the drive circuit 310, as described in Expression (2) or (3), can be calculated on the basis of the input voltage $V_{IN}$ of the drive circuit 310 and a theoretical value D of the duty ratio of the control signal, and the input voltage $V_{IN}$ of the drive circuit 310 is a known value. For this reason, by using only the known value and the current detection value of the current sensor 410, the theoretical value of the duty ratio of the control signal can be calculated. Thus, the theoretical value of the duty ratio of the control signal can be easily calculated.

Second Embodiment

Figure 5:
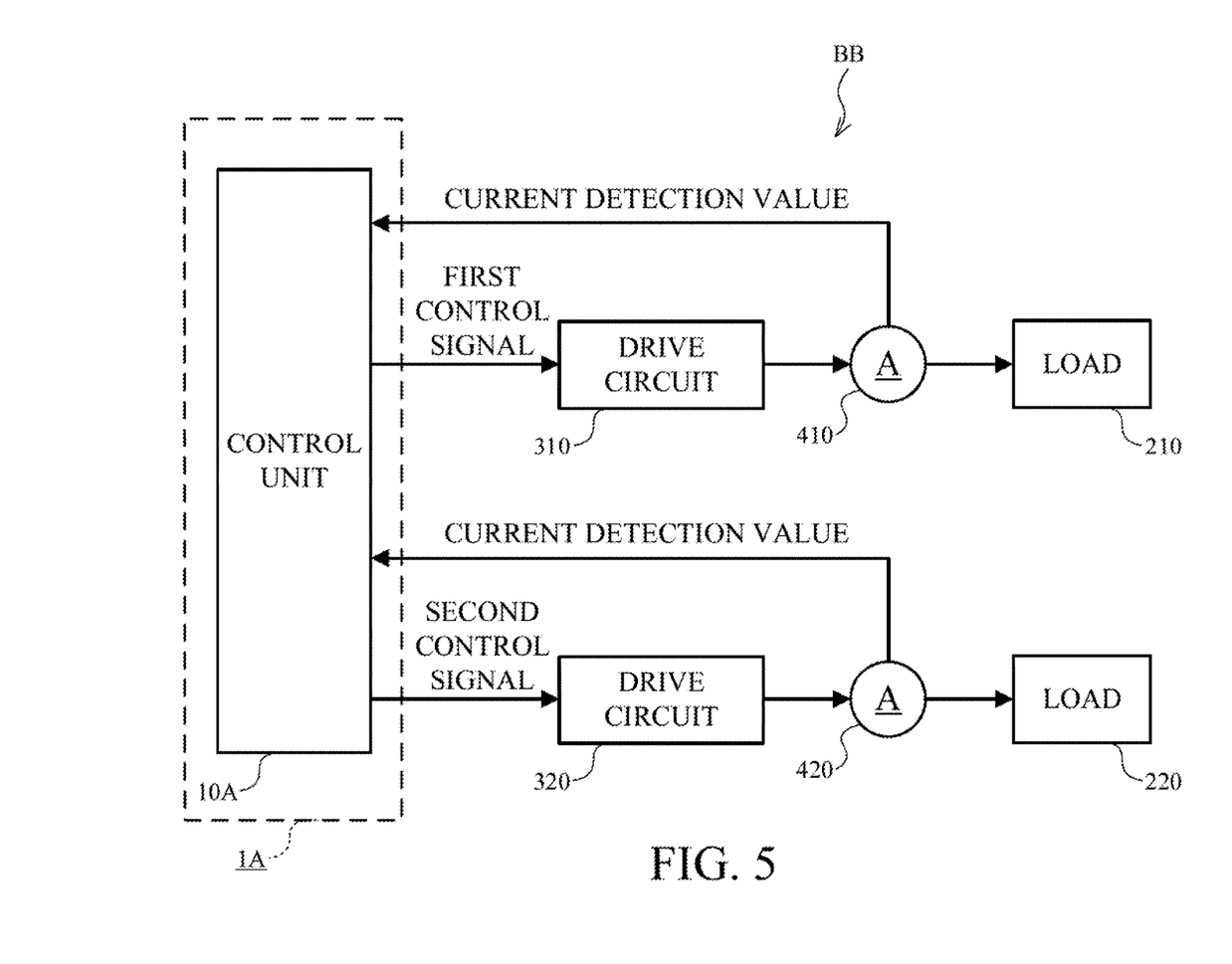
FIG. 5 is a block diagram showing a drive apparatus including a fault detecting apparatus according to a second embodiment of the present invention.
Figure 6:
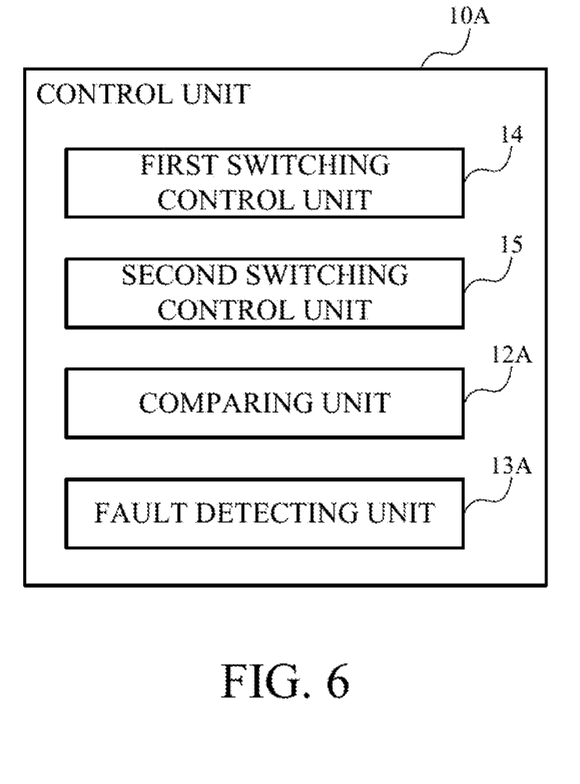
FIG. 6 is a block diagram showing a control unit included in the fault detecting apparatus according to the second embodiment of the present invention.

FIG. 5 is a block diagram of a drive apparatus BB including a fault detecting apparatus 1A according to a second embodiment of the present invention. The drive apparatus BB is to supply an electric power and a drive signal to not only the load 210 but also a load 220. The drive apparatus BB is different from the drive apparatus AA shown in FIG. 1 in that a fault detecting apparatus 1A is arranged in place of the fault detecting apparatus 1 and that a drive circuit 320 and a current sensor 420 are arranged. In the drive apparatus BB, the same reference signs denote the same constituent elements as those in the drive apparatus AA, and a description thereof will be omitted.

The drive circuit 320 includes a switch element (not shown) like the drive circuit 310. The drive circuit 320 turns on/off the switch element depending on a control signal supplied from a control unit 10A (will be described later) arranged in the fault detecting apparatus 1A to change an output. An output current from the drive circuit 320 is detected by the current sensor 420 and sent to the control unit 10A.

The fault detecting apparatus 1A includes the control unit 10A. The control unit 10A is configured by a microcomputer like the control unit 10, and, as shown in FIG. 6, includes a first switching control unit 14, a second switching control unit 15, a comparing unit 12A, and a fault detecting unit 13A.

The first switching control unit 14 supplies a control signal to the drive circuit 310 to on/off-control a switch element (not shown) arranged on the drive circuit 310. The first switching control unit 14 also supplies a control signal supplied to the drive circuit 310 to the comparing unit 12A.

The second switching control unit 15 supplies a control signal to the drive circuit 320 to on/off-control a switch element (not shown) arranged on the drive circuit 320. The second switching control unit 15 also supplies the control signal to be supplied to the drive circuit 320 to the comparing unit 12A.

It is assumed that the input/output characteristics of the drive circuit 310 are the same as the input/output characteristics of the drive circuit 320 and that an input voltage of the drive circuit 310 and an input voltage of the drive circuit 320 are equal to each other. For this reason, when a duty ratio of a control signal output from the first switching control unit 14 is made equal to a duty ratio of a control signal output from the second switching control unit 15, an output current from the drive circuit 310 and an output current from the drive circuit 320 are equal to each other.

The comparing unit 12A, like the comparing unit 12, compares a duty ratio of a control signal actually output from the first switching control unit 14 with a theoretical value of a duty ratio of a control signal supplied from the first switching control unit 14 to the drive circuit 310, and compares a duty ratio of a control signal actually output from the second switching control unit 15 with a theoretical value of a duty ratio of a control signal supplied from the second switching control unit 15 to the drive circuit 320. Furthermore, the comparing unit 12A also compares a duty ratio of a control signal actually output from the first switching control unit 14 with a duty ratio of a control signal actually output from the second switching control unit 15.

The fault detecting unit 13A detects failures of the current sensors 410 and 420 on the basis of the comparison result obtained by the comparing unit 12A.

Figure 7:
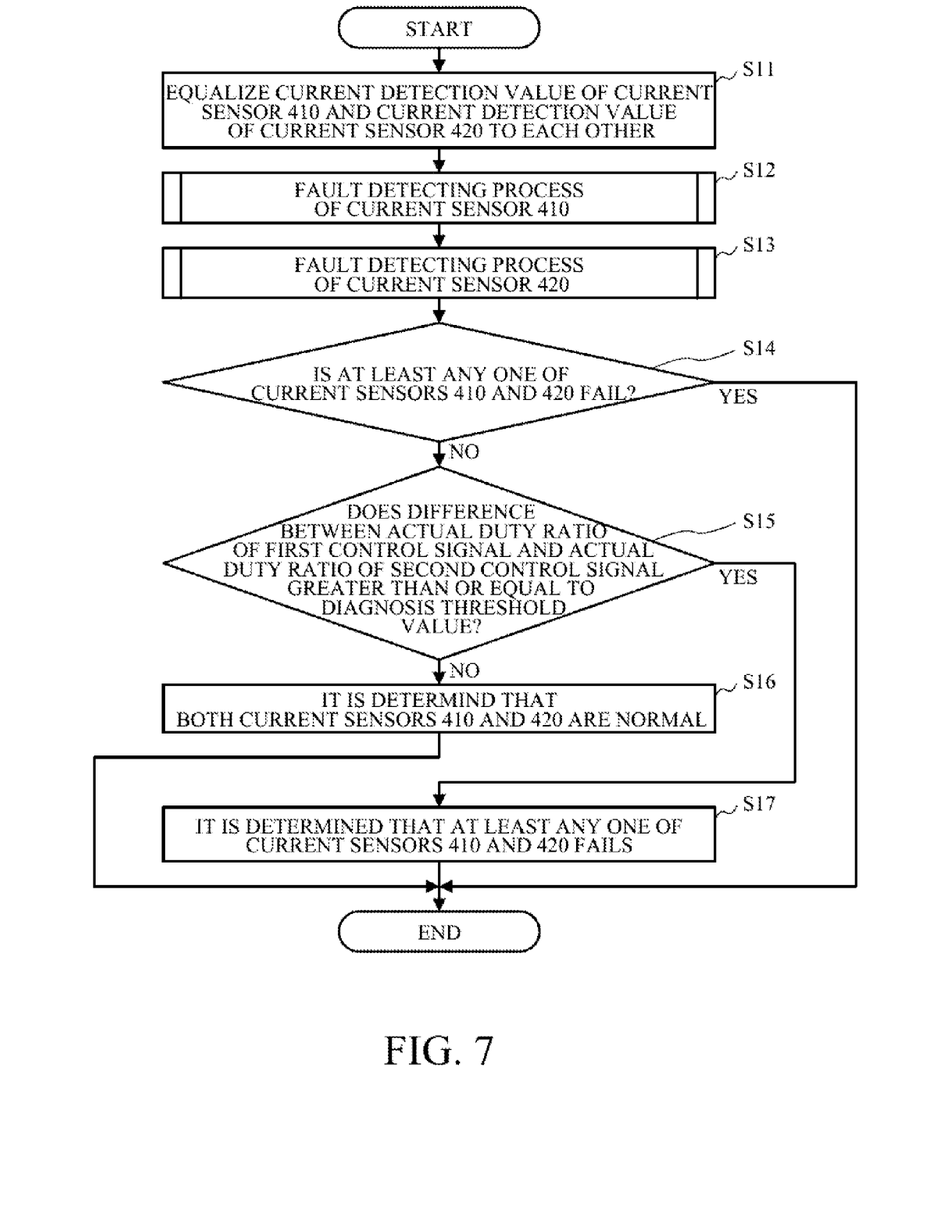
FIG. 7 is a flow chart showing a process of the fault detecting apparatus according to the second embodiment of the present invention.

FIG. 7 is a flow chart showing a process of the fault detecting apparatus 1A. The fault detecting apparatus 1A performs the process in FIG. 7 at the start of the drive apparatus BB.

In step S11, the fault detecting apparatus 1A causes each of the first switching control unit 14 and the second switching control unit 15 to supply control signals to the drive circuits 310 and 320, respectively, to make a current detection value of the current sensor 410 and a current detection value of the current sensor 420 equal to each other, and to shift the process to step S12.

In step S12, the fault detecting apparatus 1A performs a fault detecting process of the current sensor 410 (will be described below with reference to FIG. 8) to determine whether the current sensor 410 fails and to shift the process to the step S13.

In step S13, the fault detecting apparatus 1A performs a fault detecting process of the current sensor 420 (will be described later with reference to FIG. 9) to determine whether the current sensor 420 fails and to shift the process to step S14.

In step S14, the fault detecting apparatus 1A causes the fault detecting unit 13A to determine whether at least one of the current sensors 410 and 420 fails on the basis of process results in step S12 and step S13. When it is determined that at least one of the sensors 410 and 420 fails, the process in FIG. 7 is ended. When it is determined that both the sensors 410 and 420 are normal, the process is shifted to step S15.

In step S15, the fault detecting apparatus 1A causes the comparing unit 12A to determine whether a difference between an actual duty ratio of a first control signal and an actual duty ratio of a second control signal falls is greater than or equal to a predetermined diagnosis threshold value. The actual duty ratio of the first control signal is the duty ratio of the control signal actually output from the first switching control unit 14, and the actual duty ratio of the second control signal is the duty ratio of the control signal actually output from the second switching control unit 15. The determination is made by using the following Expression (4). When Expression (4) is satisfied, it is determined that the difference is greater than or equal to the diagnosis threshold value to shift the process to step S17. When Expression (4) is not satisfied, it is determined that the difference is smaller than the diagnosis threshold value to shift the process to step S16.

[Expression 4]

$$|D1-D2| \geq Th \quad (4)$$

In Expression (4), reference symbol D1 denotes the actual duty ratio of the first control signal, reference symbol D2 denotes the actual duty ratio of the second control signal, and reference symbol Th denotes the diagnosis threshold value.

In this case, the current detection values of the current sensors 410 and 420 are made equal to each other in step S11. As described above, the input/output characteristics of the drive circuits 310 and 320 are the same as each other, and, as described above, the input voltages of the drive circuits 310 and 320 are also equal to each other. For this reason, when both the current sensors 410 and 420 are normal, the actual duty ratio of the first control signal and the actual duty ratio of the second control signal are equal to each other. On the other hand, when at least one of the current sensors 410 and 420 fails, the actual duty ratio of the first control signal and the actual duty ratio of the second control signal may be different from each other. Thus, the diagnosis threshold value Th is set to a value that can determine whether the current sensors are normal or fail in consideration of accuracies of the current sensors 410 and 420 and errors of the drive circuits 310 and 320.

In step S16, the fault detecting apparatus 1A causes the fault detecting unit 13A to determine that both the current sensors 410 and 420 are normal to end the process in FIG. 7.

In step S17, the fault detecting apparatus 1A causes the fault detecting unit 13A to determine that at least one of the current sensors 410 and 420 fails to end the process in FIG. 7.

Figure 8:
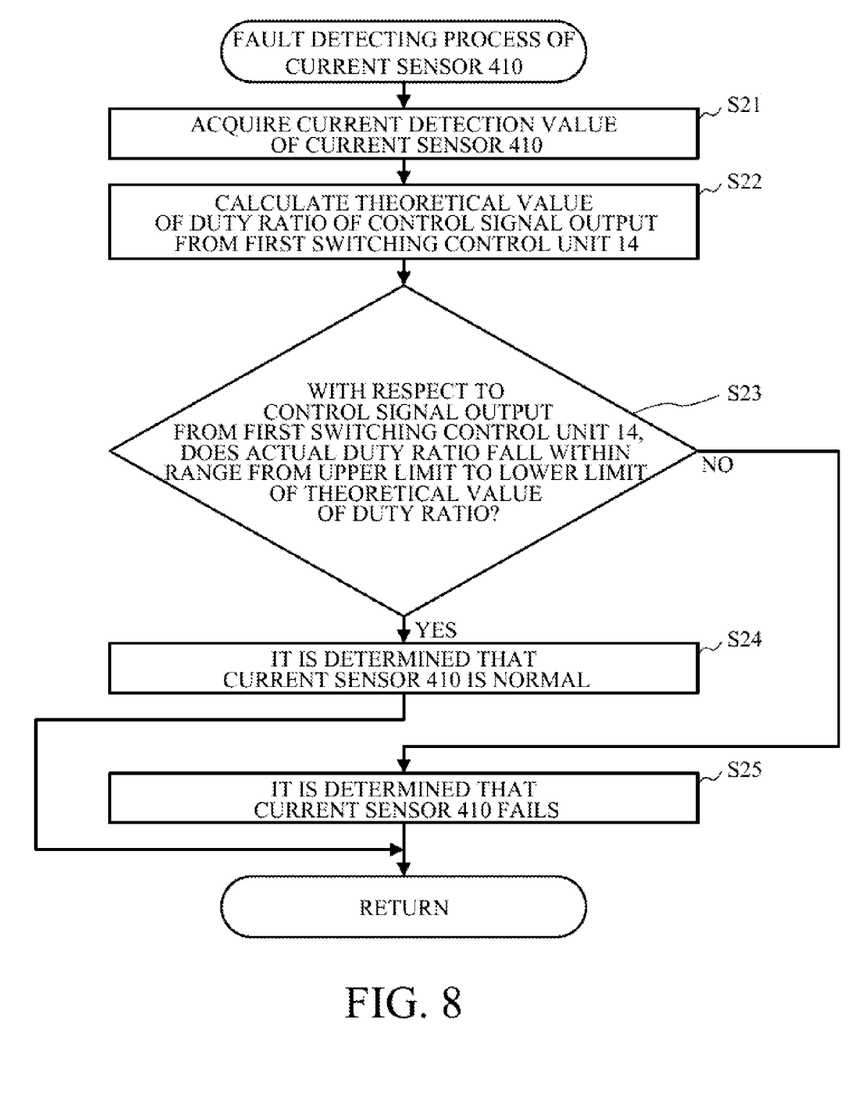
FIG. 8 is a flow chart showing a process of the fault detecting apparatus according to the second embodiment of the present invention.

FIG. 8 is a flow chart showing the fault detecting process of the current sensor 410. In the fault detecting process of the current sensor 410 in FIG. 8, the same process as the process shown in FIG. 4 is performed by using the current detection value of the current sensor 410 and the duty ratio of the control signal actually output from the first switching control unit 14 to determine whether the current sensor 410 fails.

Figure 9:
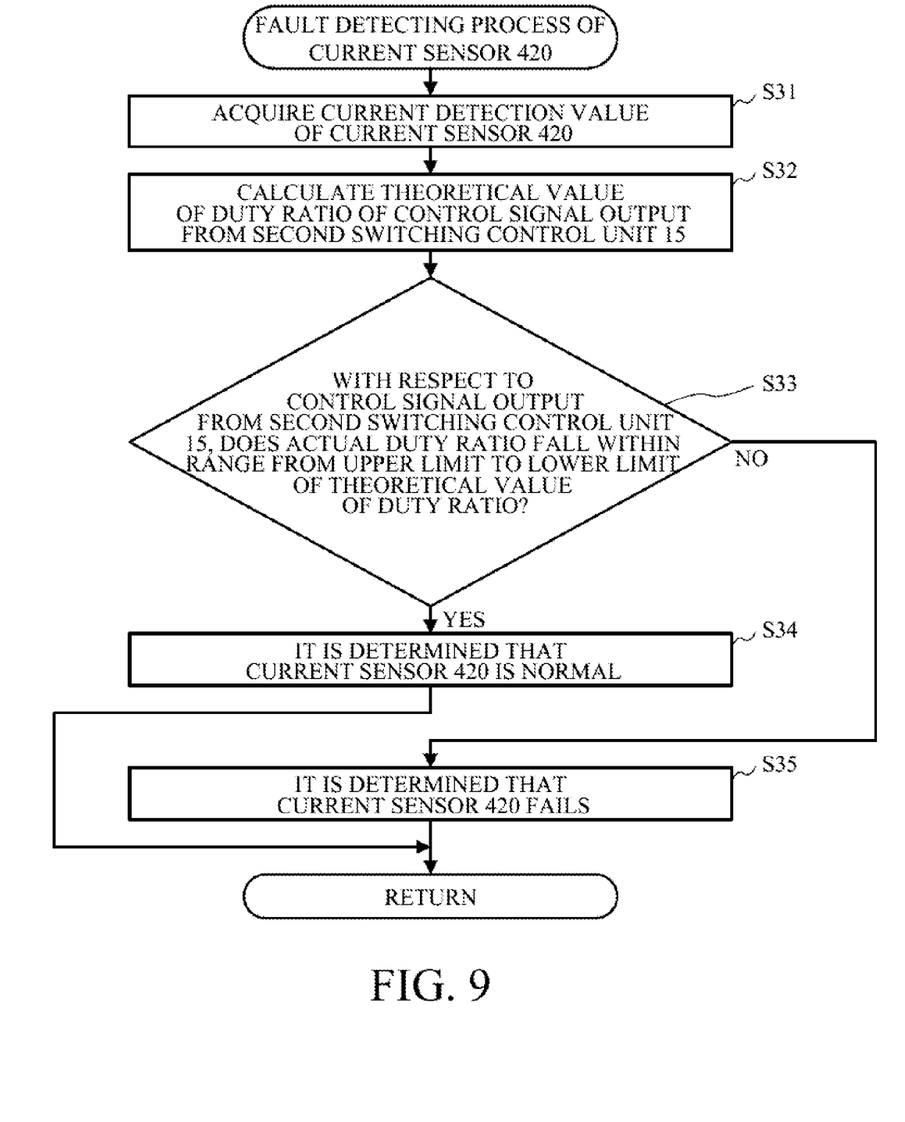
FIG. 9 is a flow chart showing a process of the fault detecting apparatus according to the second embodiment of the present invention.

FIG. 9 is a flow chart showing the fault detecting process of the current sensor 420. In the fault detecting process of the current sensor 420 in FIG. 9, the same process as the process shown in FIG. 4 is performed by using the current detection value of the current sensor 420 and the duty ratio of the control signal actually output from the second switching control unit 15 to determine whether the current sensor 420 fails.

According to the fault detecting apparatus 1A described above, in addition to the above effects that can be exerted by the fault detecting apparatus 1, and the following effect can be exerted.

The fault detecting apparatus 1A causes the first switching control unit 14 and the second switching control unit 15 to independently supply control signals to the drive circuits 310 and 320, respectively, and to make current values respectively detected by the current sensors 410 and 420 equal to each other. Furthermore, the comparing unit 12A compares the duty ratios of the control signals independently supplied to the drive circuits 310 and 320, respectively, with each other. For this reason, failures of the current sensors 410 and 420 can be more accurately detected.

The present invention is not limited to the above embodiments, and various changes and applications can be effected without departing from the spirit and scope of the invention.

For example, the first embodiment described above shows the example in which one load (load 210) is connected to the drive apparatus AA, and the second embodiment described above shows the example in which two loads (loads 210 and 220) are connected to the drive apparatus BB. However, the number of loads to be connected are not limited to the numbers described in the embodiments, and, for example, three or four loads may be connected.

REFERENCE MARKS IN THE DRAWINGS

AA, BB, CC; drive apparatus
1, 1A, 100; fault detecting apparatus
10, 10A, 110; control unit
11; switching control unit
12, 12A; comparing unit
13, 13A; fault detecting unit
14; first switching control unit
15; second switching control unit
120, 410, 420; current sensor
210, 220; load
310, 320; drive circuit

The invention claimed is:

1. A drive apparatus, comprising:
a switch element, which changes current to be applied to a load;
a current detecting circuit, which is connected to the switch element, detects the current to be applied to the load, and outputs a current detection signal; and
a control unit, which is connected to the switch element and the current detecting circuit, and receives the current detection signal from the current detecting circuit, including:
a switching control unit, which supplies a control signal to the switch element to on/off-control the switch element;
a comparing unit, which compares a duty ratio of the control signal supplied from the switching control unit to the switch element with a theoretical value of the duty ratio of the control signal, wherein a value of the duty ratio of the control signal needed for supplying a current value detected by the current detecting circuit, is defined as the theoretical value of the duty ratio of the control signal; and
a fault detecting unit, which detects a failure of the current detecting circuit on the basis of a comparison result obtained by the comparing unit, whereby the failure of the current detecting circuit can be detected without using another current detecting circuit so that the drive apparatus can be miniaturized.

2. The drive apparatus according to claim 1, wherein the comparing unit calculates the theoretical value of the duty ratio of the control signal on the basis of the voltage changing depending on the on/off operation of the switch element and a resistance of a load to which the voltage is supplied.

3. A drive apparatus comprising:
a plurality of switch elements, each of which changes current applied to a load;
a plurality of current detecting circuits, each of which detects the current to be applied to the load and outputs a current detection signal, the number of the plurality of current detecting circuits being equal to the number of the plurality of switch elements;
a control unit, which is connected to the plurality of switch elements and the plurality of current detecting circuit, and receives the current detection signal from each of the current detecting circuits, including:
a switching control unit, which independently supplies control signals to the plurality of switch elements, respectively, on/off-controls each of the plurality of switch elements, and equalizes current values detected by the plurality of current detecting circuits, respectively;
a comparing unit, which compares duty ratios of the control signals independently supplied to the plurality of switch elements, respectively, with each other, and compares the duty ratio of the control signal supplied from the switching control unit with a theoretical value of the duty ratio of the control signal in each of the switch elements, values of the duty ratios of the control signals needed for obtaining current values detected by the current detecting circuit, being defined as the theoretical values of the duty ratios of the control signals to be supplied to the plurality of switch elements for the plurality of switch elements; and
a fault detecting unit, which detects failures of the plurality of current detecting circuits on the basis of comparison results obtained by the comparing unit, whereby the failure of the plurality of current detecting circuits can be detected without using another current detecting circuit so that the drive apparatus can be miniaturized.

4. A drive apparatus comprising:
a plurality of switch elements, each of which changes current to be applied to a load;
a plurality of current detecting circuits, each of which detects the current to be applied to the load and outputs a current detection signal, the number of the plurality of current detecting circuits being equal to the number of the plurality of switch elements;
a control unit, which is connected to the plurality of switch elements and the plurality of current detecting circuits, and receives the current detection signal from each of the current detecting circuits, including:
switching control units, which independently supply control signals to the plurality of switch elements, respectively, on/off-control each of the plurality of switch elements, and equalize current values detected by the plurality of current detecting circuits respectively;
a comparing unit, which compares duty ratios of the control signals independently supplied to the plurality of switch elements, with each other; and
a fault detecting unit, which detects failures of the plurality of current detecting circuits on the basis of a comparison result obtained by the comparing unit, whereby the failure of the plurality of current detecting circuits can be detected without using another current detecting circuit so that the drive apparatus can be miniaturized.

5. A computer program product having a non-transitory computer readable medium storing a program which, when executed by a computer, causes the computer to perform a fault detecting method in a drive apparatus having a switch element which is connected to a current detecting circuit, and the current detecting circuit which detects a current changing depending on an on/off operation of the switch element,
the fault detecting method including:
a first step of supplying a control signal to the switch element to on/off-control the switch element;
a second step of, to use the current changing depending on the on/off operation of the switch element as a current value detected by the current detecting circuit, calculating a duty ratio of a control signal to be supplied to the switch element to define the duty ratio as the theoretical value of the duty ratio of the control signal;
a third step of comparing the duty ratio of the control signal supplied to the switch element in the first step with the theoretical value of the duty ratio of the control signal calculated in the second step; and
a fourth step of detecting a failure of the current detecting circuit on the basis of a comparison result obtained in the third step.

6. A computer program product having a non-transitory computer readable medium storing a program which, when executed by a computer, causes the computer to perform a fault detecting method in a drive apparatus having a plurality of switch elements and a plurality of current detecting circuits,
wherein each of the plurality of switch elements changes current applied to a load, and each of the plurality of current detecting circuits detects a current changing depending on on/off operations of each of pairs of the plurality of switch elements, the number of the plurality of current detecting circuits being equal to the number of the plurality of switch elements, and the fault detecting method includes:

a first step of independently supplying control signals to the plurality of switch elements, respectively, on/off-controlling each of the plurality of switch elements, and equalizing current values detected by the plurality of current detecting circuits respectively;

a second step of comparing duty ratios of the control signals independently supplied to the plurality of switch elements, respectively, with each other; and a third step of detecting failures of the plurality of current detecting circuits on the basis of a comparison result obtained in the second step.

* * * * *